US006842872B2

(12) United States Patent
Yedida et al.

(10) Patent No.: US 6,842,872 B2
(45) Date of Patent: Jan. 11, 2005

(54) EVALUATING AND OPTIMIZING ERROR-CORRECTING CODES USING PROJECTIVE ANALYSIS

(75) Inventors: Jonathan S. Yedida, Cambridge, MA (US); Erik B. Sudderth, Jamaica Plain, MA (US); Jean-Philippe Bouchaud, Sceaux (FR)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 500 days.

(21) Appl. No.: 09/968,182

(22) Filed: Oct. 1, 2001

(65) Prior Publication Data

US 2003/0065989 A1 Apr. 3, 2003

(51) Int. Cl.[7] .................................................. G06F 11/00
(52) U.S. Cl. ........................ 714/703; 714/790; 714/794; 714/804
(58) Field of Search ................................ 714/703, 790, 714/794, 804, 762, 763

(56) References Cited

U.S. PATENT DOCUMENTS

| 4,295,218 A | * 10/1981 | Tanner ........................ 714/762 |
| 6,073,250 A | 6/2000 | Luby et al. ..................... 714/6 |
| 6,195,777 B1 | 2/2001 | Luby et al. .................. 714/752 |
| 6,651,213 B2 | * 11/2003 | Hassner et al. ............. 714/763 |

OTHER PUBLICATIONS

Chung et al., Feb. 2001, IEEE Transactions on Information Theory, vol. 47, No. 2, "Analysis of Sum–Product Decoding of Low–Density Parity–Check Codes Using a Gaussian Approximation", pp 657–670.*

McEliece et al., Feb. 1998, IEEE Journal on Selected Areas in Communications, vol. 16, No. 2, "Turbo Decoding as an Instance of Pearl's 'Belief propagation' Algorithm", pp 140–152.*

T.J. Richardson et al., Feb. 2001, IEEE Transactions on Information Theory, vol. 47, No. 2, "The Capacity of Low–Density Parity–Check Codes Under Message–Passing Decoding", pp 599–618.*

Li Jing, Jun. 11–14, 2001, Proceedings of International Conference on Communications, vol. 7, "On the Performance of Turbo Product Codes over Partial–Response Channels", pp2176–2183.*

* cited by examiner

*Primary Examiner*—Guy J. Lamarre
*Assistant Examiner*—John P Trimmings
(74) *Attorney, Agent, or Firm*—Dirk Brinkman; Andrew Cartin

(57) ABSTRACT

A method evaluates and optimizes an error-correcting code to be transmitted through a noisy channel and to be decoded by an iterative message-passing decoder. The error-correcting code is represented by a parity check matrix which is modeled as a bipartite graph having variable nodes and check nodes. A set of message passing rules is provided for the decoder. The decoder is analyzed to obtain a set of density evolution rules including operators and operands which are then transformed to projective operators and projected operands to generate a set of projective message passing rules. The projective message passing rules are applied iteratively to the error-correcting code modeled by the bipartite graph until a termination condition is reached. Error rates of selected bits of the error-correcting code are then determined by evaluating the corresponding operands. The error rates can be passed to an optimizer to optimize the error-correcting code.

15 Claims, 4 Drawing Sheets

EVALUATING AND OPTIMIZING ERROR-CORRECTING CODES USING PROJECTIVE ANALYSIS

FIELD OF THE INVENTION

The present invention relates generally to the field of error-correcting codes for data storage and data transmission, and more particularly to evaluating and optimizing error-correcting codes.

BACKGROUND OF THE INVENTION

A fundamental problem in the field of data storage and communication is the evaluation of error-correcting codes (ECC). The general framework for the problem that our invention addresses is shown in FIG. 1. A source 110 intends to transmit a block of k bits, denoted by a vector u 111, to a destination 150. The source 110 adds redundancy bits to the source symbols by passing them through an encoder 120. The output of the encoder is a block of N bits, denoted by a vector x 121. The block of N bits pass through a channel 130, subject to noise 135, where the block is possibly corrupted into another block of N output symbols 131, denoted by a vector y. The output of the channel is then decoded 140 into a received block denoted by vector v of k bits 141 for the destination 150.

Ideally, the received block 141 will match the transmitted block 111. However, in practical conditions, some decoding failures will sometimes occur. A decoding failure called a block error occurs when at least one bit in the received block disagrees with a bit in the transmitted block. The block error rate is the probability that at least one bit of the transmitted block will be received in error, averaged over the probability distribution of transmitted blocks. In many circumstances, a better measure of merit is the bit error rate, which is the probability that any given bit will be received in error. A main objective of evaluating error-correcting codes is to determine their bit-error rates.

Error-correcting codes described by sparse generalized parity-check matrices have recently been the subject of intense theoretical interest. These types of codes were first described by R. G. Gallager, in "Low-density parity check codes," Vol.21, Research Monograph Series, MIT Press, 1963, but were not properly appreciated until recently. In the last decade, however, a variety of improved codes defined by sparse generalized parity check matrices have been described, such as turbocodes, irregular low-density parity check (LDPC) codes, Kanter-Saad codes, repeat-accumulate codes, and irregular repeat-accumulate codes.

These improved codes have three particularly noteworthy advantages. First, the codes can be decoded efficiently using message-passing iterative decoding methods, which are sometimes called "belief propagation" (BP) methods. Second, the performance of these codes can often be theoretically evaluated using a density evolution method, at least in the infinite block-length limit. Third, by using the density evolution method, it can be demonstrated that these codes are nearly optimal codes, when decoded using BP. In particular, in the infinite block-length limit, the density evolution method typically demonstrates that BP decoding correctly recovers all data blocks that have a noise level below some threshold level, and that threshold level is often not far from the Shannon limit. For a collection of reports on such codes and their associated BP decoding method, see the Special Issue on Codes on Graphs and Iterative Algorithms, IEEE Transactions on Information Theory, February, 2001.

The density evolution method dates back to R. G. Gallager's work, already cited above. The density evolution method was re-introduced in the context of the memory-less BEC by M. Luby, M. Mitzenmacher, M. A. Shokrollahi, D. Spielman, and V. Stemann, in "*Practical Loss-Resilient Codes*," Proceedings 29$^{th}$ Annual ACM Symposium on the Theory of Computing, 1997, pp. 150–159. The name "density evolution" was actually introduced when that method was generalized to other channels, including the memory-less binary symmetric channel (BSC), by T. Richardson and R. Urbanke in "*The Capacity of Low-Density Parity Check Codes Under Message-Passing Decoding*," IEEE Trans. Inform. Theory, vol 47., pp. 599–618, February 2000.

An important drawback of the density evolution method is that it only becomes exact when the graphical representation of the code, known as the bipartite or bipartite graph, has no cycles. Fortunately, it has been shown for a variety of codes, that in the limit where the block-length N of the code approaches infinity, the presence of cycles in the bipartite graph representation can be ignored, and the results of the density evolution method become exact. Because all the best-performing codes do have cycles in their bipartite graph representations, this means that in practice, application of the density evolution method is restricted to some codes in the limit where their block-length N approaches infinity.

Given a method to measure the performance of a code, one can design error-correcting codes that optimize the performance. A preferred prior art way for designing improved codes that will be decoded with BP decoding, has been to optimize certain classes of codes for the infinite block-length limit using the density evolution method, and hope that a scaled-down version still results in a near optimal code. See, for example, T. Richardson, and R. Urbanke, in "*Design of Capacity-Approaching Irregular Low-Density Parity-Check Codes*," IEEE Trans. Inform. Theory, vol. 47., pp. 619–637, February 2000.

The problem with this method is that even for very large block-lengths, such as blocks of length $N<10^4$, one is still noticeably far from the infinite-block-length limit. In particular, many decoding failures are found at noise levels far below the threshold level predicted by infinite block-length calculations. Furthermore, there may not necessarily even exist a way to scale down the codes derived from the density evolution method. For example, the best known irregular LDPC codes, at a given rate in the $N \to \infty$ limit, often have bits that participate in hundreds or even thousands of parity checks, which makes no sense when the overall number of parity checks is 100 or less.

Codes with intermediate block-length, for example block-length less than $10^4$, are important for many applications. Therefore, there is a need for a practical method to directly evaluate the performance of arbitrary intermediate block-length error-correcting codes as decoded by BP decoding methods. Aside from its utility as a part of a code design method, such a method could be used for code verification. The performance of BP decoding of parity-check codes is currently normally judged by "Monte Carlo" simulations, which randomly generate thousands or millions of noisy blocks.

Unfortunately, such simulations become impractical as a code-verification technique when the decoding failure rate is required to be extraordinarily small, as in, for example, magnetic disk drive or fiber-optical channel applications. This is a serious problem in evaluating turbo-codes or LDPC codes, which often suffer from an "error-floor" phenomenon, which is hard to detect if the error-floor is at a sufficiently low decoding failure rate.

Furthermore, it is desired that the method can be used when the channel is a binary erasure channel or a binary symmetric channel. Therefore, those channels, parity-check codes, iterative decoding methods, and the density evolution method are described in greater detail.

The Binary Erasure Channel (BEC) and Binary Symmetric Channel (BSC)

A binary erasure channel (BEC) is a binary input channel with two input symbols, 0 and 1, and with three output symbols: 0, 1, and an erasure, which can be represented by a question mark "?." A bit that passes through the channel will be received correctly with probability 1−x, and will be received as an erasure with probability x.

A binary symmetric channel (BSC) is a binary input channel with two input symbols, 0 and 1, and with two output symbols: 0, and 1. A bit will pass through the channel and be correctly received in its transmitted state with probability 1−x, and will be incorrectly inverted into the other state with probability x.

The method should be applicable to a memory-less version of the BEC and BSC. In a memory-less channel, each bit is erased or inverted independently of every other bit. Many practical channels are memory-less to a good approximation. In any case, the memory-less BEC and memory-less BSC are excellent test-beds for evaluating and designing new error-correcting codes, even when they are not always realistic practical models.

One could assume that the probability of erasure for the BEC or the inversion probability for the BSC is identical for every bit, because that is the normal realistic situation. However, it will be convenient to let the erasure probability or inversion probability depend explicitly on the bit position within the block. Thus, the bits in a block are indexed with the letter i, and the erasure probability in the BEC, or the inversion probability in the BSC, of the ith bit is taken to be $x_i$. The probability $x_i$ for all the bits can ultimately be set equal at the end of the analysis, if so desired.

Parity Check Codes

Linear block binary error-correcting codes can be defined in terms of a parity check matrix. In a parity check matrix A, the columns represent transmitted variable bits, and the rows define linear constraints or checks between the variable bits. More specifically, the matrix A defines a set of valid vectors or codewords z, such that each component of z is either 0 or 1, and $$Az=0, \quad (1)$$

where all multiplications and additions are modulo 2.

If a parity check matrix has N columns and N−k rows, then the matrix usually defines an error-correcting code of block-length N, and transmission rate k/N. If some of the rows are linearly dependent, then some of the parity checks will be redundant and the code will actually have a higher transmission rate.

As shown in FIG. 2, there is a corresponding bipartite graph for each parity check matrix, see R. M. Tanner, "A recursive method to low complexity codes," IEEE Trans. Info. Theory, IT-27, pages 533–547, 1981. A Tanner graph is a bipartite graph with two types of nodes: variable nodes i (1–6) denoted by circles 201, and check nodes A, B, and C denoted by squares 202. In a bipartite graph, each check node is connected to all the variable nodes participating in the check. For example, the parity check matrix $$A = \begin{pmatrix} 1 & 1 & 0 & 1 & 0 & 0 \\ 1 & 0 & 1 & 0 & 1 & 0 \\ 0 & 1 & 1 & 0 & 0 & 1 \end{pmatrix} \quad (2)$$

is represented by the bipartite graph shown in FIG. 2.

In practical applications, the graphs representing codes typically include thousands of nodes connected in any number of different ways, and contain many loops (cycles). Evaluating codes defined by such graphs, or designing codes that perform optimally, is very difficult.

Error-correcting codes defined by parity check matrices are linear. This means that each codeword is a linear combination of other codewords. In a check matrix, there are $2^k$ possible codewords, each of length N. For the example given above, the codewords are 000000, 001011, 010110, 011101, 100110, 101101, 110011, 111000. Because of the linearity property, any of the codewords are representative, given that the channel is symmetric between inputs 0 and 1, as in the BEC or BSC. For the purposes of evaluating a code, it is normally assumed that the all-zeros codeword is transmitted.

Generalized Parity Check Matrices

Generalized parity check matrices define many of the modern error-correcting codes, such as turbo-codes, Kanter-Saad codes, and repeat-accumulate codes. In a generalized parity check matrix, additional columns are added to a parity check matrix to represent "hidden" variable nodes. Hidden variable nodes participate in parity checks and help constrain the possible code-words of a code, but they are not sent through the channel. Thus, the receiver of a block must decode the bit values without any direct information—in a sense, one can consider all hidden nodes to arrive "erased." The advantage of hiding variable nodes is that one improves the transmission rate of the code. A good notation for the hidden state variables is a horizontal line above the corresponding columns in the parity-check matrix, e.g., one can write $$A = \begin{pmatrix} \overline{1} & 1 & 0 & 1 & 0 & 0 \\ 1 & 0 & 1 & 0 & 1 & 0 \\ 0 & 1 & 1 & 0 & 0 & 1 \end{pmatrix} \quad (47)$$

to indicate a code where the first variable node is a hidden node. To indicate that a variable node is a hidden node, an open circle is used, rather than a filled-in circle. Such a graph, which generalizes bipartite graphs, is called a "Wiberg graph," see N. Wiberg, "*Codes and decoding on general graphs,*" Ph. D. Thesis, University of Linkoping," 1996, and N. Wiberg et al., "*Codes and iterative decoding on general graphs,*" Euro. Trans. Telecomm, Vol. 6, pages 513–525, 1995.

Iterative Message-Passing Decoding

It is desired to provide a method for evaluating the performance of an iterative message-passing decoder for a code where each possible state of each message can take on a finite number of discrete values. Good examples of such decoding methods are the belief propagation (BP) decoding method for the BEC, and the "Gallager A" decoding method for the BSC, describe in greater detail below. Other examples of such decoders are the quantized belief propagation decoders described in detail by T. Richardson and R. Urbanke in "*The Capacity of Low-Density Parity Check Codes Under Message-Passing Decoding,*" IEEE Trans. Inform. Theory, vol 47, pp. 599–618, February 2000.

Belief Propagation Decoding in the BEC

It is important to note that the BEC never inverts bits from 0 to 1, or vice versa. If all-zeros codewords are transmitted, the received word must therefore consist entirely of zeros and erasures. For the case of the BEC, BP decoding works by passing discrete messages between the nodes of the bipartite graph. Each variable node i sends a message $m_{ia}$ to each connected check node a. The message represents the state of the variable node i. In general, the message can be in one of three states: 1, 0, or ?, but because the all-zeros codeword is always transmitted, the possibility that $m_{ia}$ has a bit value of one can be ignored.

Similarly, there is a message $m_{ai}$ sent from each check node a to all the variable nodes i connected to the check node. These messages are interpreted as directives from the check node a to the variable node i about what state the variable node should be in. This message is based on the states of the other variable nodes connected to the check node. The check-to-bit messages can, in principle, take on the bit values 0, 1, or ?, but again only the two messages 0 and ? are relevant when the all-zeros codeword is transmitted.

In the BP decoding process for the BEC, a message $m_{ia}$ from a variable node i to a check node a is equal to a non-erasure received message because such messages are always correct in the BEC, or to an erasure when all incoming messages are erasures. A message $m_{ai}$ from a check node a to a variable node i is an erasure when any incoming message from another node participating in the check is an erasure. Otherwise, the message takes the value of the modulus-2 sum of all incoming messages from other nodes participating in the check.

BP decoding is iterative. The iterations are indexed by an integer t, which must be greater than or equal to one. At the first iteration, when t=1, the variable-to-check node messages are initialized so that all variable nodes that are not erased by the channel send out messages equal to the corresponding received bit. Then, the check-to-variable messages are determined by the standard rule mentioned above. At the end of the first iteration, a variable node can be considered decoded if any of its incoming messages is a non-erasure. Such messages must always be correct, so the bit is decoded to the value indicated by the message.

At each subsequent iteration, one first updates all the messages from variable nodes to check nodes, and then one updates all the messages from check nodes to variable nodes, and then checks each bit to see whether it has been decoded. One stops iterating when some criterion is reached, for example, after a fixed number of iterations, or after the messages converge to stationary states. For the particularly simple BEC, messages can only change under the BP decoding process from erasure messages to non-erasure messages, so the iterative decoding process must eventually converge.

The "Gallager A" Decoding Method for the BSC

The "Gallager A" decoding method for the BSC was first described by R. G. Gallager, in "Low-density parity check codes," Vol.21, Research Monograph Series, MIT Press, 1963. It works as follows. As in BP decoding for the BEC, there are two classes of messages: messages from variable nodes to check nodes; and messages from check nodes to the variable nodes. However, the meaning of the messages is slightly different.

The decoding method is initialized by each variable node sending a message to every connected check node. The message is 0 or 1 depending on the bit value that was received through the channel. In turn, each check nodes send a message to connected variable nodes. This message is 0 or 1 and is interpreted as commands about the state that the variable nodes should be in. In particular, the message is the modulus-2 sum of the messages that the check node receives from the other variable nodes to which it is connected.

In further iterations of the Gallager A decoding method, each variable node continues to send the received bit value to the connected check nodes, unless the variable node receives sufficient contradictory messages. In particular, if all the other connected check nodes, aside from the check node that is the recipient of the message, send a variable node a message that contradicts the bit value it received from the channel, then the variable node sends the message it received from all the other check nodes.

The Gallager A decoding method is iterated until some criterion, like a fixed number of iterations, is reached. At every iteration, each bit is decoded to the bit value that the variable node receives from the channel, unless all the incoming messages from the connected check nodes agree on the other bit value.

Density Evolution

Density evolution is a method for evaluating a parity check code that uses iterative message-passing decoding as described above. Specifically, density evolution can determined the average bit error rate of a code. Density evolution is now described for the case of BP decoding in the BEC. Similar density evolution methods have been derived for other iterative message-passing decoders such that each message can only be in a finite number of discrete states, for example the Gallager A decoding method, as described above, or the quantized belief propagation decoders. In general, the density evolution methods are represented as sets of rules relating the probabilities that each of the messages used in the decoder is in each of its states.

For the case of the density evolution method for BP decoding in the BEC, a probability, averaged over all possible received blocks, that each message is an erasure, is considered. The iterations are indexed by an integer t. A real number $p_{ia}(t)$, which represents the probability that a message $m_{ia}$ is an erasure at iteration t, is associated with each message $m_{ia}$ from variable nodes to check nodes. Similarly, a real number $q_{ai}(t)$, which represents the probability that the message $m_{ai}$ is an erasure at iteration t, is associated with each message $m_{ai}$ from check nodes to variable nodes. In the density evolution method, probabilities $P_{ia}(t)$ and $q_{ai}(t)$ are determined in a way that is exact, as long as the bipartite graph representing the error-correcting code has no loops.

A "rule" that determines the probability $p_{ia}(t)$ is $$p_{ia}(t+1) = x_i \prod_{b \in N(i) \setminus a} q_{bi}(t), \qquad (3)$$

where $j \in N(i) \setminus a$ represents all check nodes directly connected to a neighboring variable node i, except for the check node a. Note, that in density evolution, this rule includes operands x and q, and a multiplication operator.

This rule can be derived from the fact that for a message $m_{ia}$ to be an erasure, the variable node i must be erased during transmission, and all incoming messages from other check nodes must be erasures as well. Of course, if the incoming messages $q_{ai}(t)$ are statistically dependent, then the rule is not correct. However, in the density evolution method, such dependencies are systematically ignored. In a bipartite graph with no loops, each incoming message is in fact independent of all other messages, so the density evolution method is exact.

Similarly, the rule $$q_{ai}(t) = 1 - \prod_{j \in N(a) \setminus i} (1 - p_{ja}(t)) \quad (4)$$

can be derived from the fact that a message $m_{ai}$ can only be in a non-erasure state when all incoming messages are in a non-erasure state, again ignoring statistical dependencies between the incoming messages $p_{ja}(t)$.

The density evolution rules (3) and (4) are evaluated by iteration. The appropriate initialization is $p_{ia}(t=1) = x_i$ for all messages from variable nodes to check nodes. At each iteration t, it is possible to determine $b_i(t)$, which is the probability of a failure to decode at variable node i, from the rule $$b_i(t) = x_i \prod_{a \in N(i)} q_{ai}(t), \quad (5)$$

In other words, the rules (3, 4, and 5) enable one to evaluate the code in terms of its bit error rate.

Exact Solution of a Small Code

As stated above, the density evolution rules (3, 4, and 5) are exact when the code has a bipartite graph representation without loops. It is very important to understand that the density evolution rules are not exact when a bipartite graph represents a practical code that does have loops, because in that case, the BP messages are not independent, in contradiction with the assumptions underlying rules (3, 4, and 5).

Consider, as an example of a bipartite graph with no loops, the error-correcting code defined by a parity check matrix $$A = \begin{pmatrix} 1 & 1 & 0 & 0 \\ 0 & 1 & 1 & 1 \end{pmatrix} \quad (6)$$

and represented by a corresponding bipartite graph shown in FIG. 2. This code has four codewords: 0000, 0011, 1101, and 1110. If the 0000 message is transmitted, then there are sixteen possible received messages: 0000, 000?, 00?0, 00??, 0?00, and so on. The probability of receiving a message with $n_e$ erasures is $x^{n_e}(1-x)^{4-n_e}$, where we have taken all the $x_i$, to be equal to the same value x.

It is easy to determine the exact probability that a given bit remains an erasure after t iterations of decoding have completed by summing over the decoding results for all the sixteen possible received messages weighted by their probabilities. For example, after decoding to convergence, the first bit will only fail to decode to a 0 when one of the following messages is received: ???0, ??0?, or ????, so the exact probability that the first bit will not decode to a 0 is $2x^3(1-x) + x^4 = 2x^3 - x^4$.

If the focus is on the last bit, then the bit will ultimately be correctly decoded, unless one of the following messages is sent: 00??, 0???, ?0??, ??0? or ????. Therefore, the overall probability that the fourth bit is not correctly decoded is $x^2(1-x)^2 + 3x^3(1-x) + x^4 = x^2 + x^3 - x^4$.

In the density evolution method, applied to this code, the values for the following variables:

$p_{11}(t), p_{21}(t), p_{22}(t), p_{32}(t), p_{42}(t), q_{11}(t), q_{12}(t), q_{22}(t), q_{23}(t), q_{24}(t), b_1(t), b_2(t), b_3(t), b_4(t),$ are determined by $$p_{11}(t) = x \quad (7)$$

$$p_{21}(t+1) = xq_{22}(t) \quad (8)$$

$$p_{22}(t+1) = xq_{12}(t) \quad (9)$$

$$p_{32}(t) = x \quad (10)$$

$$p_{42}(t) = x \quad (11)$$

$$q_{11}(t) = p_{21}(t) \quad (12)$$

$$q_{12}(t) = p_{11}(t) \quad (13)$$

$$q_{22}(t) = 1 - (1 - p_{32}(t))(1 - p_{42}(t)) \quad (14)$$

$$q_{23}(t) = 1 - (1 - p_{22}(t))(1 - p_{42}(t)) \quad (15)$$

$$q_{24}(t) = 1 - (1 - p_{22}(t))(1 - p_{42}(t)) \quad (16)$$

and $$b_1(t) = xq_{11}(t) \quad (17)$$

$$b_2(t) = xq_{12}(t)q_{22}(t) \quad (18)$$

$$b_3(t) = xq_{23}(t) \quad (19)$$

$$b_4(t) = xq_{24}(t) \quad (20)$$

with the initial conditions that $$p_{11}(t=1) = p_{21}(t=1) = p_{22}(t=1) = p_{32}(t=1) = p_{42}(t=1) = x. \quad (21)$$

Solving these rules yields the exact bit error rates at every iteration. For example, one can find that $b_4(t=1) = 2x^2 - x^3$ and $b_4(t \geq 2) = x^2 + x^3 - x^4$. These results correspond to the fact that the 00??, 0?0?, 0???, ?0??, ??0? and ???? messages will not be decoded to a zero at the fourth bit after the first iteration so that the probability of decoding failure at the fourth bit is $2x^2(1-x)^2 + 3x^3(1-x) + x^4 = 2x^2 - x^3$; but after two or more iterations, the 0?0? is decoded correctly, so the probability of decoding failure at the fourth bit is $x^2(1-x)^2 + 3x^3(1-x) + x^4 = x^2 + x^3 - x^4$.

The Large Block-Length Limit

If all local neighborhoods in the bipartite graph are identical, the density evolution rules can be simplified. For example, consider a regular Gallager code, which is represented by a sparse random parity check matrix characterized by the restriction that each row contains exactly $d_c$, ones, and each column contains exactly $d_v$, ones. In that case, it can be assumed that all the $p_{ia}(t)$ are equal to the same value p(t), all the $q_{ai}(t)$ are equal to the same value q(t), and all the $b_i(t)$ are equal to the same value b(t). Then, $$p(t+1) = xq(t)^{d_v - 1} \quad (22)$$

$$q(t) = 1 - (1 - p(t))^{d_c - 1} \quad (23)$$

and $$b(t) = xq(t)^{d_v}, \quad (24)$$

which are the density evolution rules for $(d_v, d_c)$ regular Gallager codes, valid in the $N \to \infty$ limit.

The intuitive reason that these rules are valid, in the infinite block-length limit, is that as $N \to \infty$, the size of typical loops in the bipartite graph representation of a regular Gallager code go to infinity. As a result, all incoming messages to a node are independent, and a regular Gallager code behaves like a code defined on a graph without loops.

Solving rules (22, 23, and 24) for specific values of $d_v$ and $d_c$ yields a solution $p(t\to\infty)=q(t\to\infty)=b(t\to\infty)=0$, below a critical erasure value, known as the "threshold," of $x_c$. This means that decoding is perfect for erasure probabilities below the threshold. Above $x_c$, $b(t\to\infty)$ has a non-zero limit, which correspond to decoding failures. The value $x_c$ is easy to determine numerically. For example, if $d_v=3$ and $d_c=5$, then $x_c\approx 0.51757$.

These determinations of the threshold at infinite block-length can be generalized to irregular Gallager codes, or other codes like irregular repeat-accumulate codes that have a finite number of different classes of nodes with different neighborhoods. In this generalization, one can derive a system of rules, typically with one rule for the messages leaving each class of node. By solving the system of rules, one can again find a critical threshold $x_c$, below which decoding is perfect. Such codes can thus be optimized, in the $N\to\infty$ limit, by finding the code that has maximal noise threshold $x_c$. This is the way the prior-art density evolution method has been utilized to evaluate error-correcting codes.

Drawbacks of the Density Evolution Method

Unfortunately, the conventional density evolution method is erroneous for codes with finite block-lengths whose graphical representation has loops. One might think that it is possible to solve rules (3, 4 and 5) for any finite code, and hope that ignoring the presence of loops is not too important a mistake. However, this does not work out, as can be seen by considering regular Gallager codes. Rules (3, 4, and 5) for a finite block-length regular Gallager code have exactly the same solutions as one would find in the infinite-block-length limit, so one would not predict any finite-size effects. However, it is known that the real performance of finite-block-length regular Gallager codes is considerably worse than that predicted by such a naive method. In practice, the application of the density evolution method is limited to codes whose block-length is very large, so that the magnitude of the error is not too great.

Therefore, there is a need for a method to correctly evaluate finite length error-correcting codes that do not suffer from the problems of the prior art evaluation methods.

SUMMARY OF THE INVENTION

The present invention provides a method for evaluating the performance of an error-correcting code, represented by an arbitrary generalized parity check matrix, and decoded by an iterative message-passing method that sends discrete messages, subject to a memory-less binary erasure channel or a memory-less binary symmetric channel.

Associated with the ith variable bit of the code is a channel noise level $x_i$, which represents the probability of erasure for that bit for the binary erasure channel, or the inversion probability for that bit for the binary symmetric channel.

A set of rules corresponding to the prior-art density evolution method for evaluating the performance of the error-correcting code is provided. In the prior art density evolution method, the outputs of the rules are evaluated as real numbers during each iteration. The real number represents the probability that a message is in a particular state during an iteration of the decoder.

The invention transforms the prior-art density evolution rules into "projective" rules. The transformation replaces the real numbers representing the possible states of each message at every iteration of the decoder, by "projected" polynomials. A projected polynomial is a polynomial in the $x_i$, where no term of the polynomial has an exponent of order greater than one. Furthermore, ordinary operators in the set of rules corresponding to the prior art density evolution method are replaced with "projective" operators. In a projective operation on two projected polynomials, any resulting exponents of an order greater than one are reduced down to the order of one.

The projective transformation results in a set of iterative update rules for the projected polynomials. A set of parameters of interest, including the number of iterations, and the variable bits of interest, or specific messages of interest in the decoding method, are specified. Iterating for the specified number of iterations provides exact results for the error rates for the code at the bits or messages of interest.

For the case of the memory-less BEC, a more efficient implementation can be used, wherein each projected polynomial is only represented by a small number of leading positive terms, and projective multiplication is modified so that only positive leading terms in a projected polynomial are retained. Such a representation is called a "stopping set representation," and is exact for the case of the memory-less BEC.

The projective method can require an amount of memory and computation time that grows exponentially with the block-length of the code. To obtain results using a reasonable amount of memory and computation time for codes with long block-lengths, the projected polynomials are approximated by projected polynomials containing a limited number of terms. A lower bound on the probability represented by a projected polynomial is obtained by retaining only a sub-set of the terms in the exact projected polynomial. For the BEC, a lower bound is obtained even more efficiently by retaining only a sub-set of the terms in the stopping set representation of the projected polynomial. For the BEC, an upper bound is obtained by using the stopping set representation of projected polynomials, and successively replacing pairs of terms by another term containing the intersection of the nodes involved in the pair of terms.

In a practical application, the present invention can be used to optimize error-correcting codes by searching for the error-correcting code of a specified data block size and transmission rate with the best performance in terms of decoding failure as a function of noise. The decoding failure rates for transmitted variable bits are used to guide the search for the optimal code. Exact patterns of noisy transmitted bits that cause a decoding failure can also be obtained by the method, and are also used to guide the search for an optimal code.

DETAILED DESCRIPTION OF THE PREFERRED EMBODIMENT

Introduction

Our invention evaluates the performance of error-correcting codes (ECC) decoded by a message-passing decoding process for which every message can be in a finite number of different discrete states. Our method tracks, at each iteration of a decoding process, the probability that each message sent by the decoding process is in any of its possible states. In contrast to the prior-art density evolution method, our method is exact for any code represented by a parity-check matrix, including codes whose bipartite graph representation contains cycles (loops).

Our method represents each probability of interest by a "projected polynomial," in contrast to the prior-art density evolution method, which uses real numbers to represent the probabilities. By a projected polynomial we mean a polynomial in the form $x_i$, where no term of the polynomial has any exponents of order greater than one.

Moreover, the operations that are performed on the projective polynomials must be "projective" in the sense that any terms in the resulting polynomials that contain exponents greater than one have those exponents reduced to one. The probabilities of interest are retained as projected polynomials until their actual value is desired, at which point they are evaluated by replacing all the parameters $x_i$ with the appropriate values.

System Overview

Figure 1:
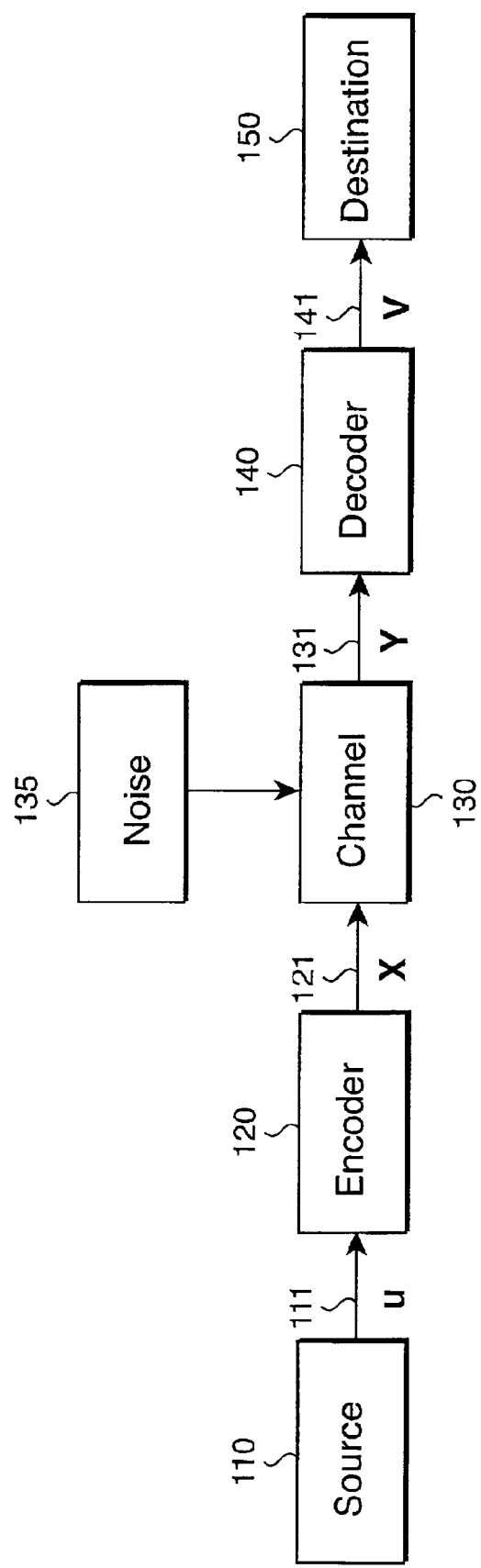
FIG. 1 is a block diagram for the problem of decoding an encoded message transmitted through a noisy channel.
Figure 2:
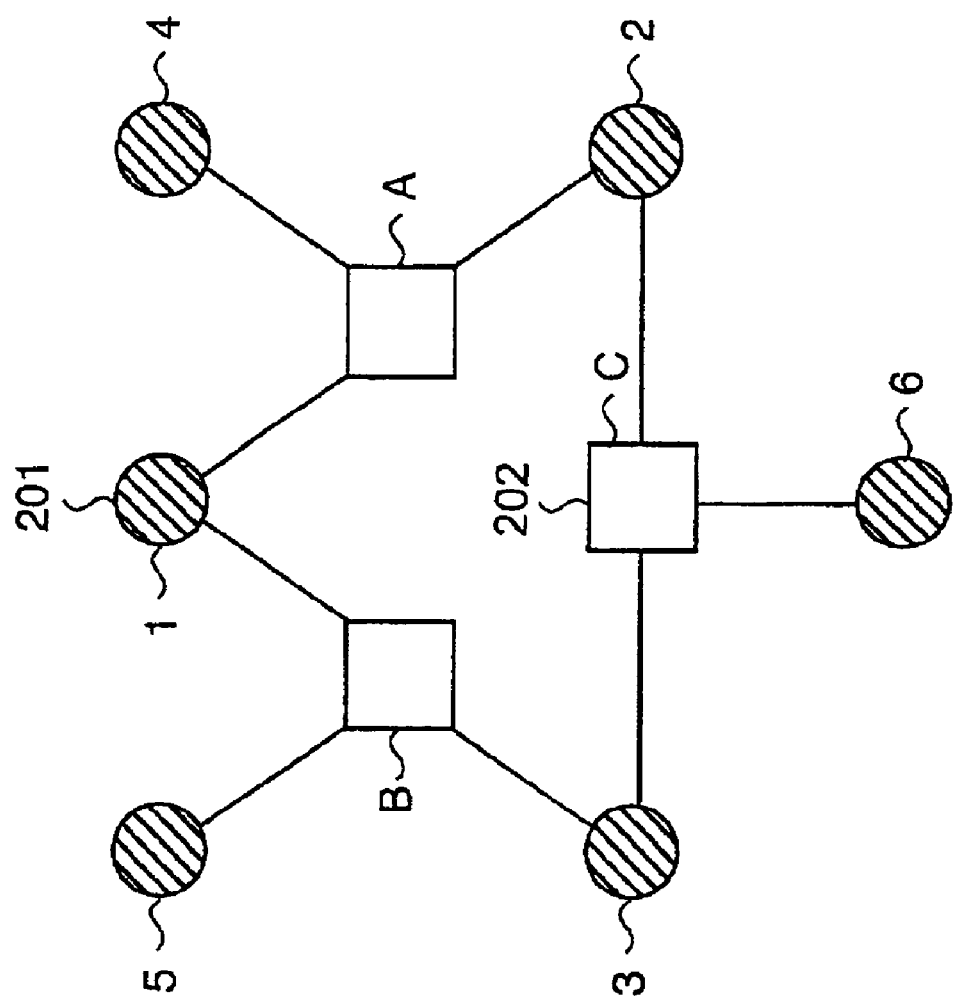
FIG. 2 is a bipartite graph representing a simple error-correcting code.
Figure 3:
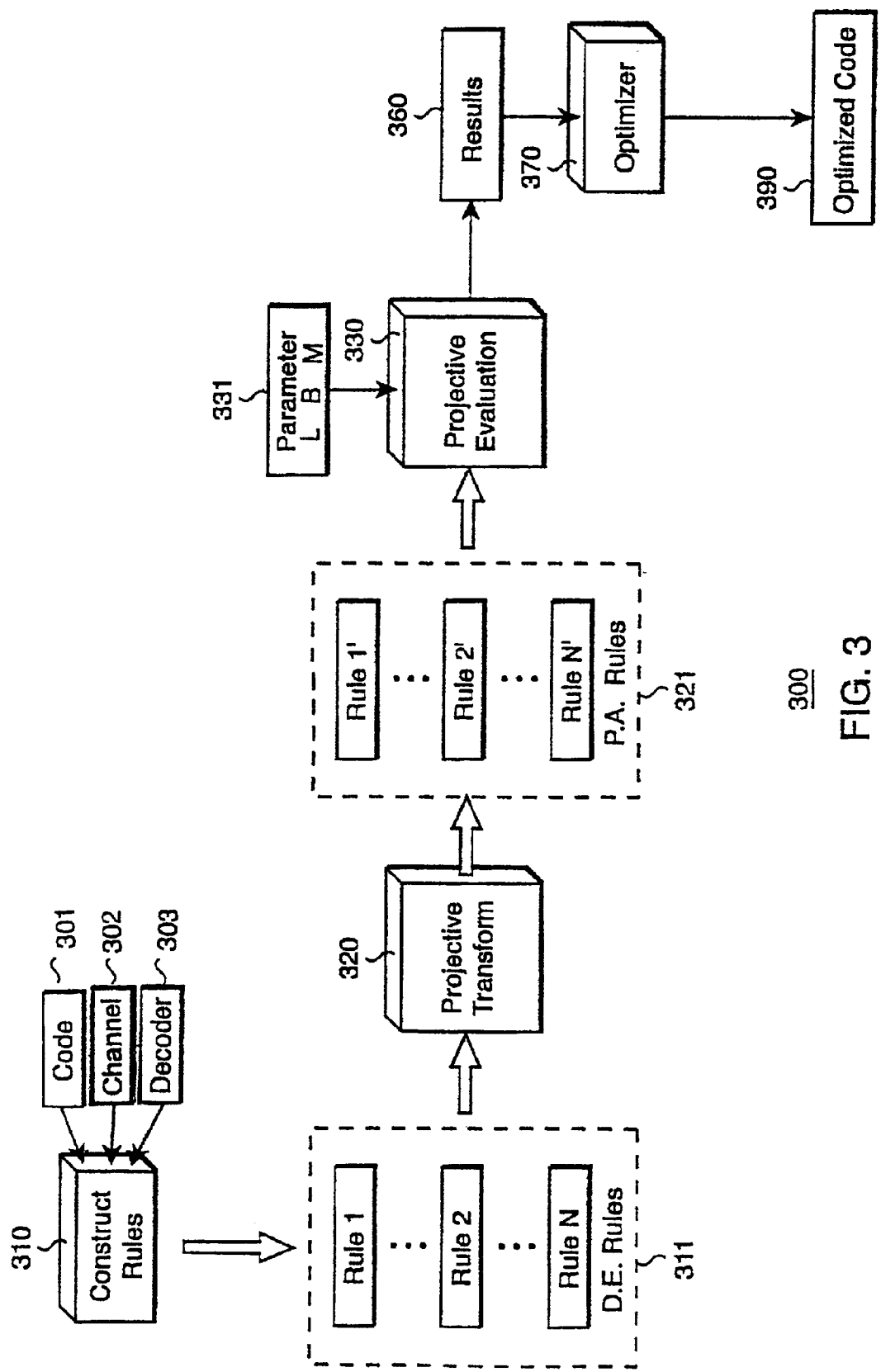
FIG. 3 is a block diagram of a projective analysis method for evaluating the performance of error-correcting codes according to the invention.

FIG. 3 shows the projective evaluation method 300 of our invention. A given error-correcting code 301 is represented by a generalized parity check matrix. A given channel 302 is either the binary erasure channel (BEC) or the binary symmetric channel (BSC.) A given decoder 303 uses an iterative message-passing method such that each message can be in a finite number of discrete states. For the given code 301, channel 302, and decoder 303, construct 310 a set of density evolution rules 311 representing a density evolution (D.E.) method for the code to be decoded after transmission through the channel.

This set of iterative density evolution rules 311 represent relations between probabilities of states of every message in the decoder 303. The set of rules also depend explicitly on parameters $x_i$, which represent a probability that an ith bit is erased in the BEC, or inverted in the BSC. The set of rules 311 derived for the density evolution method, as described above, are transformed 320 into a corresponding set of projective analysis (P.A.) rules 321 for the method and system 300 according to our invention.

The transformation 320 replaces each real-valued variable, that is, an operand representing a probability in the density evolution rules 311, with a transformed variable in the projective rules 321. The operands in the projective analysis rules 321 are in the form of "projected polynomials," described in further detail below. Also, each operator in the density evolution rules 311 is replaced with a "projective" operation that will also be further described below.

The resulting projective rules 321 are then used to evaluate 330 the code 301, given the channel 302 and the decoder 303. The projective rules 321 can be used to obtain error rates at any bit, or the probabilities that any message is in any of its states, at any iteration of the decoding process. If desired, further information can be obtained, including the exact patterns of bit erasures or inversions that cause a decoding failure.

The evaluation 330 iteratively applies the rules 321 to update the values of the projected polynomials. The projected polynomials represent the probability that a message will be in any of its states, or the probability that any of the bits will be decoded erroneously. The iteration stops when a termination condition is reached. Then, error rates are evaluated as real numbers for selected or all bits of the code 301. Thus, for example bit error rates averaged over all bits can be determined. The results 360 of the evaluation 330 can then be passed to an optimizer 370 to generate an optimized error-correcting code 390, as described in further detail below.

Projected Operands and Projective Operations

We first described the concepts of a "projected polynomial" and "projective multiplication" as applied to projected polynomials. A projected polynomial is a polynomial such that every term of the polynomial has no exponent of order greater than one. For example, $m(x_1, x_2, x_3)=1-x_1x_2+x_2x_3-2x_1x_2x_3$ is a projected polynomial in $x_1$, $x_2$, and $x_3$, but $p(x_1, x_2, x_3)=1-x_1x_2+x_2x_3-x_1^2x_2x_3$ is not, even though it is a polynomial, because in the $x_1^2x_2x_3$ term, the $x_1$ variable is squared.

The addition of two projected polynomials necessarily results in another projected polynomial. However, the multiplication of two projected polynomials might not result in a projected polynomial. To take a simple example, $x_1$ and $x_1x_2$ are both projected polynomials, but their product, using ordinary multiplication, is $x_1^2x_2$, which is not a projected polynomial. Therefore, we use "projective multiplication" when multiplying projected polynomials. In this operation, we multiply two projected polynomials in the ordinary way, and then reduce any resulting exponent greater than one down to one.

The operation of reducing exponents in a polynomial is called a "projection" because it reduces the space of polynomials down to the sub-space of projected polynomials. We denote projective multiplication of two projected polynomials $m_1$ and $m_2$ by $m_1 \otimes m_2$, and call such a product a "projective multiplication."

Projected polynomials are a "field" under ordinary addition and projective multiplication. This means that we can use the commutative, associative, and distributive laws.

Projection Evaluation for Determining Probabilities of Errors

Our projective analysis is useful for determining the probability of events that are possible states of statistically independent binary random variables. For example, in the practical application of evaluating and optimizing error-correcting codes as described herein.

Consider N statistically independent binary random variables, $Y_1, Y_2, \ldots, Y_N$, which take on the values 0 or 1. As an example, in the application of the evaluation of error-correcting codes in the BEC as described by our method, the discrete values 1 or 0 indicate whether or not a received bit was erased.

We denote the probability that $Y_i=1$ by $x_i$ and the probability that $Y_i=0$ by $1-x_i$. There are $2^N$ elements of the joint sample space for $Y_1, Y_2, \ldots, Y_N$, each including a setting for each random variable. We refer to the elements of the joint sample space as "fundamental events."

Because the binary random variables are statistically independent, the probability of a fundamental event is a multiplication of terms such as $x_i$, or $(1-x_i)$. For example, if N=3, one of the eight fundamental events is $(Y_1=1, Y_2=0, Y_3=1)$, and its probability is $x_1(1-x_2)x_3$. The probability of a fundamental event always is a projected polynomial as a function of the variable $x_i$.

We denote the probability of a fundamental event F by P(F). It will be useful to note that for any fundamental event F, $$P(F) \otimes P(F) = P(F), \quad (25)$$

and that for any two different fundamental events $F_1$ and $F_2$, $$P(F_1) \otimes P(F_2) = 0. \quad (26)$$

For example, if N=1, $P(Y_1=1)=x_1$ and $P(Y_1=0)=1-x_1$, while $x_1 \otimes (1-x_1)=0$, $x_1 \otimes x_1 = x_1$, and $(1-x_1) \otimes (1-x_1)=1-x_1$, which is consistent with rules (25) and (26).

Following normal usage in probability theory, we define an "event" E to be a set of fundamental events. For example, when N=3, the event that $Y_1=Y_2=Y_3$ consists of the set of two fundamental events ($Y_1=0$, $Y_2=0$, $Y_3=0$) and ($Y_1=1$, $Y_2=1$, $Y_3=1$). The probability of an event P(E) is the sum of projected polynomials, for example, $P(Y_1=Y_2=Y_3)=x_1x_2x_3+ (1-x_1)(1-x_2)(1-x_3)$. In general, if the event E includes the set of k fundamental events $F_1, F_2, \ldots, F_k$, then $$P(E) = \sum_{i=1}^{k} P(F_i).$$

The notation $E_1 \cap E_2$ denotes the event such that both the events $E_1$ and $E_2$ occur. The event $E_1 \cap E_2$ is set of fundamental events that belong to the intersection of the fundamental events in $E_1$ and in $E_2$. Subject to our assumed scenario that fundamental events are the joint states of statistically independent binary variables, the probability of the event $E_1 \cap E_2$ can be obtained using our projective multiplication:

$$P(E_1 \cap E_2) = P(E_1) \otimes P(E_2). \tag{27}$$

The correctness of rule (27) is demonstrated by expanding the events $E_1$ and $E_2$ into their fundamental events and noting that, according to rules (25) and (26), the only surviving cross-terms are those for which the fundamental event in $E_1$ is the same as the fundamental event in $E_2$. Thus, the surviving terms precisely give the sum of the probabilities of the fundamental events that belong to the intersection of the events $E_1$ and $E_2$.

A basic definition of probability theory is that two events $E_1$ and $E_2$ are statistically independent if the probability that they both occur is the multiplication of their probabilities:

$$P(E_1 \cap E_2) = P(E_1)P(E_2). \tag{28}$$

Rule (28) is only valid for statistically independent events, but rule (27), using a projective multiplication instead of an ordinary multiplication, is valid for any two events, subject to our scenario that events are constructed from fundamental events that are joint states of N statistically independent binary variables.

We denote by $E_1 \cup E_2$ the event where either of the events $E_1$ or $E_2$, or both, occur. The event $E_1 \cup E_2$ includes the fundamental events that belong to the union of the fundamental events in $E_1$ and in $E_2$. Subject again to our assumed scenario that fundamental events are the joint states of statistically independent binary variables, the probability of the event $E_1 \cup E_2$ is $$P(E_1 \cup E_2) = P(E_1) + P(E_2) - P(E_1) \otimes P(E_2). \tag{29}$$

Rule (29) follows from rule (27) and the general laws of probability.

Together, rules (27) and (29) exactly determine the probabilities that two events will both occur, or that at least one of them will occur, even if the two events are statistically dependent. These rules are sufficient to exactly determine the performance of error-correcting codes decoded by iterative decoding methods in the BEC or BSC.

Projective Evaluation for Error-Correcting Codes Decoded by BP in the BEC

Our method 300 can be applied to any parity-check code, decoded by an iterative message-passing decoding method, with a finite number of discrete states for each message, in the memory-less BEC and memory-less BSC channels.

Because our method has an important practical application in belief propagation decoding of parity-check codes in the memory-less BEC, we now describe our method for that case. We index the N variable nodes of a code by the letter i, and label the erasure rate of the ith node by $x_i$. Note that our method distinguishes the erasure rate at each node, even when, as is normally the case, the erasure rates are actually equal.

We consider the average probability of failure for BP decoding over many blocks. The iterations are indexed by an integer t. As in the density evolution method, we use the variable $p_{ia}(t)$ to represent the probability that the message $m_{ia}$ is an erasure at iteration t.

However, in the prior art density evolution method, the probability $p_{ia}(t)$ is a real number, whereas in our projective method, $p_{ia}(t)$ is a projected polynomial as a function of the $x_i$. Similarly, we use a projected polynomial $q_{ai}(t)$ to represent the probability that the message $m_{ai}$ is an erasure at iteration t, and the projected polynomial $b_i(t)$ to represent the probability that the node i is decoded as an erasure at iteration t.

In contrast with the prior art, our evaluation method 300 is exact for any parity-check code when the probabilities in the rules 321 are presented by projected polynomials, rather than real numbers, and when ordinary multiplications are replaced by projective multiplications. Thus, to determine the values of the projected polynomials $p_{ia}(t)$ from the projected polynomials $q_{ai}(t)$, we use the analog of density evolution rule (3):

$$p_{ia}(t+1) = x_i \otimes \prod_{b \in N(i) \setminus a} q_{bi}(t), \tag{30}$$

where the multiplication is a projective multiplication, as defined above.

Intuitively, rule (30) can be understood as follows. A variable node i sends an erasure message to a check node a when it is erased by the channel, which occurs with probability $x_i$, and all incoming messages from neighboring check nodes, other than a are also erasures. Thus, for an erasure to occur, a number of different events must all occur, and therefore rule (27) calls for a projective multiplication. Rule (30) is correct even when the different incoming messages $q_{ai}(t)$ are statistically dependent.

The other necessary rules are similarly transformed from the prior art density evolution versions:

$$q_{ai}(t) = 1 - \prod_{j \in N(a) \setminus i} (1 - p_{ja}(t)), \tag{31}$$

and $$b_i(t) = x_i \otimes \prod_{a \in N(i)} q_{ai}(t), \tag{32}$$

where the multiplications are now understood to be projective multiplications.

Rule (31) is correct because a message from a check node a to a variable node i is an erasure when any of the incoming messages to node a is an erasure. Rule (32) is correct because a variable node is decoded incorrectly only if it is erased by the channel and all incoming messages are also erasures.

Projective Evaluation

To evaluate 330 the projective rules 321, we apply rules (30, 31, and 32) and specify a set of input parameters 331.

The set of parameters of interest can include the number of iterations L, the set of variable bits of interest B, or the set of specific messages of interest M in the decoding method 303.

We initialize the projected polynomials $p_{ia}(t=1)=x_i$. We then iterate the rules (31), (32), and then again (30), (31), and (32), in that order, to obtain new projected polynomials at every iteration.

To convert the projected polynomials into probabilities represented by real numbers, we assign the true value of the BEC erasure rate x for all the $x_i$, and evaluate the resulting polynomials. Note, in the prior art density evolution, the probabilities are calculated as real numbers at each iteration.

The evaluation 330 produce exact results 360 for the code 301. Thus, we can input a code 301, channel 302, and decoder 303, and obtain as output an exact prediction of the bit error rate at any selected nodes of the bipartite graph, i.e., bit positions.

Example Code

Figure 4:
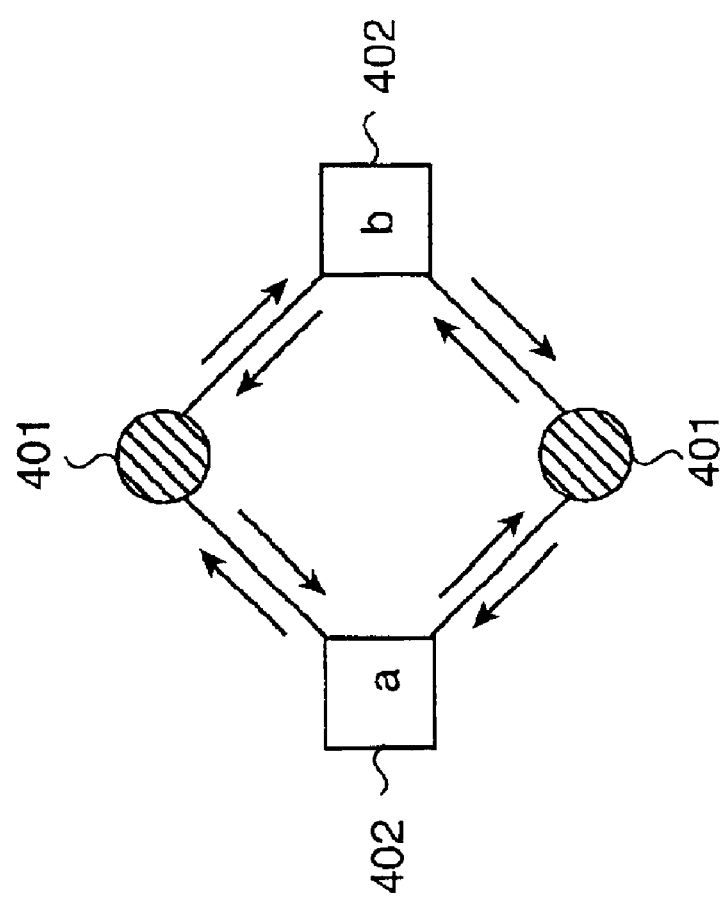
FIG. 4 is a bipartite graph to be evaluated according to the invention.

FIG. 4 shows how the projective method 300 can correctly evaluate the performance of an error-correcting code that is evaluated incorrectly by the prior art density evolution method. We consider a very small example code defined by a parity-check matrix $$A = \begin{pmatrix} 1 & 1 \\ 1 & 1 \end{pmatrix}. \tag{33}$$

This parity-check code has two variable bits 401, and two constraining check bits 402, one of which is clearly redundant. The redundant constraint has been introduced to induce a loop in the bipartite graph 400 for the code. Larger practical codes normally have loops even when there are no redundant constraints.

Exact Results for the Example Code

We exactly evaluate the performance of BP decoding by explicitly averaging over all possible received messages for this code in the BEC in order to compare the prior art density evolution method and the projective method according to the invention. Such an exact evaluation is of course only possible for small codes. However, the utility of our method also extends to larger error-correcting codes for which an exact evaluation by explicitly summing over all possible received messages is impractical.

If a "00" block is transmitted, four possible blocks can be received after transmission through the BEC: 00, 0?, ?0, and ??. The first bit is erased with probability $x_1$, and the second bit is erased with probability $x_2$. These probabilities of erasure may be, and normally are, equal, but we allow them to be different so that we can compare in detail with the results from the projective method.

The probability of receiving a "00" block is $(1-x_1)(1-x_2)$; the probability of receiving a "0?" block is $(1-x_1)x_2$; the probability of receiving a "?0" block is $x_1(1-x_2)$; and the probability of receiving a "??" block is $x_1 x_2$.

If the "00" block is received, then no message sent by the BP decoding process can ever be an erasure message. If the "??" block is received, all messages sent by the BP decoding process are erasure messages, and the block cannot be decoded. If the "0?" block is received, the first variable node initially sends the two check nodes a '0' message, while the second variable node sends the two check nodes an erasure message. Then, at the first iteration, the check nodes send the first variable node an erasure message, and send the second variable node a '0' message. The block is successfully decoded after one iteration, because the first bit will receive a '0' message over the channel, and the second bit will receive a '0' message from both check nodes connected to the first bit. No further erasure messages are sent. The analysis for the "?0" block is similar, except that the role of the first and second bit is reversed.

Summing over the four possible received blocks, weighted by their probabilities, we see that the first bit initially sends an erasure to both check nodes with probability $x_1$, but after one or more iterations, the probability that it sends an erasure is $x_1 x_2$. In terms of our previously established notation, $$p_{1a}(t=1)=p_{1b}(t=1)=x_1, \tag{34}$$

$$p_{1a}(t\geq 2)=p_{1b}(t\geq 2)=x_1 x_2. \tag{35}$$

Summing over the four possible received blocks, we also get, in terms of our previous notation, $$p_{2a}(t=1)=p_{2b}(t=1)=x_2, \tag{36}$$

$$p_{2a}(t\geq 2)=p_{2b}(t\geq 2)=x_1 x_2, \tag{37}$$

$$q_{a1}(t=1)=q_{b1}(t=1)=x_2, \tag{38}$$

$$q_{a2}(t=1)=q_{b2}(t=1)=x_1, \tag{39}$$

$$q_{a1}(t\geq 2)=q_{b1}(t\geq 2)=q_{a2}(t\geq 2)=q_{b2}(t\geq 2)=x_1 x_2, \tag{40}$$

$$b_1(t\geq 1)=b_2(t\geq 1)=x_1 x_2. \tag{41}$$

Comparing Density Evolution and Projective Analysis Results for the Small Example Code Now we confirm that our projective method reproduces the exact results for this example. We initialize:

$$p_{1a}(t=1)=p_{1b}(t=1)=x_1, \tag{42}$$

$$p_{2a}(t=1)=p_{2b}(t=1)=x_2, \tag{43}$$

which correspond to rules (34) and (36). Then, using the projective rule (31), we obtain $$q_{a1}(t=1)=q_{b1}(t=1)=x_2, \tag{44}$$

$$q_{a2}(t=1)=q_{b2}(t=1)=x_1, \tag{45}$$

in agreement with rules (38) and (39). Using projective rule (32), we obtain $$b_1(t=1)=b_2(t=1)=x_1 x_2, \tag{46}$$

in agreement with rules (41). Note that already at this point, our projective method corrects the erroneous result that would be given by the prior art density evolution method. The density evolution method incorrectly gives $b_1(t=1)=x_1 x_2^2$ and $b_2(t=1)=x_1^2 x_2$, note the power of two in the polynomial However, with our projective method, the offending power of two is reduced back down to one.

The reason that the density evolution method gives the wrong answer is that it does not recognize that the probability that check node a sends an erasure message to variable node 1 is statistically dependent on the probability that check node b sends an erasure message to variable 1. It incorrectly treats these events as if they were independent, which they are not.

Using projective rule (30), we obtain $$p_{1a}(t=2)=p_{2a}(t=2)=p_{1b}(t=2)=p_{2b}(t=2)=x_1 x_2 \tag{47}$$

in agreement with rules (35) and (37).

Upon further iterating our rules, we recover all the exact results listed above. In contrast, the results obtained by the density evolution method become progressively more inaccurate with each iteration, and in fact, for $x_1=x_2=x<1$, the density evolution method predicts $b_1(t)=b_2(t)=x^{2^{t+1}}$ which approaches zero as t goes to infinity, in contrast with the correct result $b_1(t)=b_2(t)=x^2$. The correct result is simply a reflection of the fact that for decoding to fail, the "??" block must be received, which occurs with probability $x^2$.

The density evolution method result becomes progressively more incorrect because it multiplies probabilities of erasures as if they were independent, and therefore with each iteration they incorrectly appear to become less probable. A similar phenomenon occurs in the density evolution analysis of regular Gallager codes.

Recall that the density evolution method incorrectly predicts that for finite block-lengths, regular Gallager codes decode all blocks if the erasure rate is below some threshold. This incorrect and over-optimistic prediction results from ignoring the loops in the graph for the code, and the resulting statistical dependencies between messages.

The reason for the success of our projective method is that it correctly tracks the precise fundamental events that cause each message to send an erasure, and can therefore correctly account for statistical dependencies between the messages. For example, when $q_{a1}=q_{b1}=x_1x_2$, that means that the check nodes a and b only send variable node 1 an erasure upon the fundamental event that the "??" block was received.

The Stopping Set Representation

When the projective method is applied to BP decoding on the BEC, the projected polynomials can be stored in a more efficient form, which we call the "stopping set representation," and a corresponding change is made in the projective operations.

A general projected polynomial that arises in the projective method for BP decoding on the BEC can be expanded into a sum of terms, each of which is product of $x_i$, with integer coefficients.

For example, a typical projected polynomial is $m(x_1, x_2, x_3)=x_1x_3+x_2-x_1x_2x_3$, which expands into three terms. We say that a given term depends on a set of nodes if it contains $x_i$ factors corresponding to those nodes. For example, the term $x_1x_3$ depends on nodes 1 and 3.

A "minimal term" in a projected polynomial is one that depends on a set of nodes that does not have any sub-set of nodes such that the sub-set of nodes is the set of nodes depended upon by another term in the projected polynomial. For example, in the projected polynomial $m(x_1, x_2, x_3)=x_1x_3+x_2-x_1x_2x_3$, the terms $x_1x_3$ and $x_2$ are minimal terms, but the term $x_1x_2x_3$ is not a minimal term, because it depends on a set of nodes that has sub-sets (either the set of node 2, or the set of nodes 1 and 3) that are the sets of nodes depended upon by other terms in the projected polynomial. The nodes that a minimal term depends on are called a "stopping set" for the projected polynomial.

For all the projected polynomials that arise in the projective method for evaluating BP decoding in the BEC, the full projected polynomial can be reconstructed from a list of the minimal terms.

To reconstruct the full projected polynomial from a list of the minimal terms, we sum each minimal term in the list, then subtract the projective multiplication of every pair of minimal terms, then add the projective multiplication of every triplet of minimal terms, then subtract the projective multiplication of every quadruplet of minimal terms, etc., until we have exhausted all possible combinations of minimal terms in the list. For example, if we have a minimal term list $\{x_1x_2, x_2x_3, x_4\}$, then it should be expanded to the full projected polynomial $m(x_1, x_2, x_3, x_4)=x_1x_2+x_2x_3+x_4-x_1x_2x_3-x_1x_2x_4-x_2x_3x_4+x_1x_2x_3x_4$.

The representation of a projected polynomial in terms of its list of minimal terms, which we call the "stopping set" representation, is clearly much more compact than the ordinary representation. The representation is also a good intuitive one, for stopping sets represent minimal patterns of node erasures that cause a decoding failure for BP decoding on the BEC.

When projected polynomials are represented by their stopping set representations, the operations involved by the projective update rules are simplified. In particular, the probability of events that depend on the union of other events can be determined in the stopping set representation by directly taking a union of minimal term lists representing the other events, and then deleting from the resulting list any terms that are no longer minimal terms. Thus, for rule (31), we determine the expression $$q_{ai}(t) = 1 - \prod_{j \in N(a) \setminus i} (1 - p_{ja}(t))$$

by taking a union of all the $p_{ja}(t)$ minimal term lists, and then deleting from the list any terms that are no longer minimal terms. For example, if $$q=1-(1-p_1)(1-p_2), \tag{48}$$

and $$p_1=\{x_1x_2, x_2x_3\}, \tag{49}$$

while $$p_2=\{x_1x_2x_3, x_3x_4\}, \tag{50}$$

then we find that $$q=\{x_1x_2, x_2x_3, x_3x_4\}, \tag{51}$$

without needing to bother to expand out the projected polynomials to their full representations, and then apply projective multiplication.

We often need to take projective multiplications of two projected polynomials in their stopping set representations, as in rules (30) and (32). We simplify the operation as follows.

We form a list of the projective multiplications of all pairs of minimal terms from the two projected polynomials, and then delete from the list any terms that are no longer minimal terms. For example, to compute $p_1 \otimes p_2$, with $p_1$ and $p_2$ as given by rules (49) and (50), we generate creates the list of four terms $\{x_1x_2 \otimes x_1x_2x_3, x_1x_2 \otimes x_3x_4, x_2x_3 \otimes x_1x_2x_3, x_2x_3 \otimes x_3x_4\}$ which simplifies to the list $\{x_1x_2x_3, x_1x_2x_3x_4, x_1x_2x_3, x_2x_3x_4\}$, and then, by deleting out non-minimal terms we obtain $$p_1 \otimes p_2=\{x_1x_2x_3, x_2x_3x_4\}. \tag{52}$$

Obtaining Lower and Upper Bounds Efficiently

The projective method, as we have described it so far is an exact evaluation method. Unfortunately, the amount of memory required to store all the projected polynomials grows rapidly with the block-length of the code being analyzed. Beyond a certain block-length, which depends on the amount of memory available, it becomes impractical to store the full projected polynomials. Thus, it is useful to approximate the projected polynomials in a way that requires less memory.

In general, a variety of such approximations can be made. One might also want to obtain upper and lower bounds on the projected polynomials while reducing the number of terms in each projected polynomial. By upper and lower bounds, we mean a maximum and minimum of a projected polynomial. Lower bounds can be obtained by removing terms that are guaranteed to be positive. Upper bounds can be obtained by replacing pairs of terms with single terms that are guaranteed to have greater magnitude than the pair.

In order to obtain consistent lower (and respectively upper) bounds, one needs to guarantee that when one starts with a lower (and respectively upper) bound for all the projected polynomials, one still has a lower (and respectively upper) bound on the result after applying a projective analysis rule. For some cases, like the case of BP decoding on the BEC which we discuss below, that guarantee is straightforward, but otherwise, one might need to modify the projective analysis rules to insure that lower and upper bounds are maintained consistently.

As an example, we obtain upper and lower bounds for the case of the projective method for BP decoding on the BEC. In that case, the stopping set representation of projected polynomials can be exploited. To obtain a lower bound on the projected polynomials, we remove some of the minimal terms in its stopping set representation. For example, if $m(x_1, x_2, x_3, x_4)=\{x_1x_2, x_2x_3, x_1x_3x_4\}$, then we lower-bound the projected polynomial by removing any of the three terms.

Recall that all the probabilities $x_i$ ultimately have values that are less than or equal to one. Normally, one would therefore choose to remove the terms that depend on a larger number of nodes, for these must be of smaller magnitude and the resulting approximation will be better. Thus, we normally choose to remove the $x_1x_3x_4$ term from the projected polynomial given above.

Many other possible systematic lower bound approximation schemes are possible. For example, we can limit each projected polynomial to a fixed number of terms, keeping the terms that have the fewest nodes. Alternatively, we keep all terms that have fewer than some maximum number of nodes. A third possibility is to relate the maximum number of permissible nodes in a term to the number of nodes in the term with the fewest nodes. A practitioner skilled in the art can devise other possibilities.

To obtain an upper bound on a projected polynomial, using fewer terms than in the original projected polynomial, we replace pairs of minimal terms in the stopping set representation, with another term that depends only on the nodes in the intersection of the two stopping sets. For example, to obtain an upper bound on the projected polynomial $m(x_1, x_2, x_3, x_4)=\{x_1x_2, x_2x_3, x_1x_3x_4\}$, we remove the two terms $x_1x_2$ and $x_2x_3$, and replace these terms with the term $x_2$, to obtain the upper-bound projected polynomial $\{x_2, x_1x_3x_4\}$. The upper bound procedure works in such cases because we know that $$x_2 \geq x_1x_2 + x_2x_3 - x_1x_2x_3 \qquad (53)$$

for $0 \leq x_i \leq 1$.

Again, many systematic upper bound approximation schemes are possible. For example, we can replace pairs of terms with single terms until no more than some maximum number of terms is left. Alternatively, we can stop replacing pairs of terms when one there is no replacement that does not reduce the minimal number of nodes that any terms has. Again, many other specific schemes are possible.

If we use lower (and respectively upper) bounds exploiting the stopping set representation for every projected polynomial obtained from every computation in the projective analysis method applied to BP decoding for the BEC, then all resulting probabilities of interest as determined by using the rules are also guaranteed to be lower (and respectively upper) bounds.

This can be understood as follows. The lower (and respectively upper) bounds, using the stopping set representation, will always approximate the probability of an event by the probability of another event with strictly fewer (and respectively more) fundamental events. The projective analysis of BP decoding on the BEC only involves probabilities of unions or intersections of events. The union or intersection of events containing fewer (and respectively more) fundamental events must also contain fewer (and respectively more) fundamental events than the union or intersection of the original events. Therefore, it too will be a lower (and respectively upper) bound.

Optimizing Better Error-Correcting Codes

Given that the density evolution method has been used in the past as a guide to generate the best-known practical error-correcting codes, we can generate even better codes with our projective method. With the projective method according to our invention, we can, given a channel and decoding method, input an error-correcting code defined by an arbitrary generalized parity check matrix, and obtain as output a prediction of the bit error rate at each node.

We can use this output in an objective function for a guided search through the space of possible improved codes. For example, we can try to find a N=100 blocklength, transmission rate ½ code with no hidden states that achieves a bit error rate of less than $10^{-15}$ at the highest possible erasure rate when decoded by BP for the BEC channel. We do this by iteratively evaluating codes of the correct blocklength and rate, using our projective method, and using any known search techniques, e.g., greedy descent, simulated annealing, genetic process, etc. to search through the space of valid parity check matrices.

Because we directly focus on the correct measure of merit, i.e., the bit error rate itself, rather than the threshold in the infinite block-length limit, the search according to the invention improves on the results obtained using the prior art density evolution process. We can guide the search because we have information about the bit error rate at every node. For example, it might make sense to "strengthen" a weak variable node with a high bit error rate by adding additional parity check nodes, or we can "weaken" strong nodes with a low bit error rate by turning the weak nodes into hidden nodes, thus increasing the transmission rate.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. A method for evaluating and optimizing an error-correcting code to be transmitted through a noisy channel and to be decoded by an iterative message-passing decoder, comprising:

representing the error-correcting code by a parity check matrix;

modeling the parity check matrix as a bipartite graph having a plurality of variable nodes and check nodes;

providing a set of message passing rules for the decoder;

analyzing the decoder to obtain a set of density evolution rules including operators and operands;

transforming the operators to projective operators and the operands to projected operands to generate a set of projective message passing rules, wherein the projected operand is in the form of a projected polynomial; and iteratively applying the projective message passing rules to the error-correcting code modeled by the bipartite graph until a termination condition is reached; and determining error rates of selected bits of the error-correcting code by evaluating the corresponding operands.

2. The method of claim 1 further comprising:

passing the error rates to an optimizer to optimize the error-correcting code.

3. The method of claim 1 wherein the bipartite graph includes at least one loop.

4. The method of claim 1 wherein each term of a result after a projective operation has all exponents not greater than one.

5. The method of claim 1 wherein the channel is a binary symmetric channel.

6. The method of claim 1 wherein the channel is a binary erasure channel.

7. The method of claim 1 further comprising:

determining lower bounds for the projected polynomials.

8. The method of claim 1 further comprising:

determining upper bounds for the projected polynomials.

9. The method of claim 1 further comprising:

representing a particular projected polynomial as a list of minimal terms, wherein each minimal term of the projected polynomial depends on a set of variable nodes of the bipartite graph that does not have any sub-set of variable nodes such that the sub-set of variable nodes is the set of variable nodes depended upon by another term in the projected polynomial.

10. The method of claim 9 further comprising:

determining a lower bound for the projected polynomials.

11. The method of claim 10 further comprising:

approximating a particular projected polynomial by eliminating selected minimal terms in the list of minimal terms.

12. The method of claim 9 further comprising:

determining an upper bound for the projected polynomials.

13. The method of claim 12 further comprising:

approximating a particular projected polynomial by replacing pairs of minimal terms in the list of minimal terms by another minimal term of greater magnitude.

14. The method of claim 1 wherein the termination condition is a predetermined number of iterations.

15. The method of claim 1 further comprising:

determining probabilities that messages will be in certain states.

* * * * *